United States Patent
Jagannathan et al.

(10) Patent No.: US 10,148,261 B1
(45) Date of Patent: Dec. 4, 2018

(54) ON CHIP ADAPTIVE JITTER REDUCTION HARDWARE METHOD FOR LVDS SYSTEMS

(71) Applicant: NXP USA, Inc., Austin, TX (US)

(72) Inventors: Srikanth Jagannathan, Austin, TX (US); Kumar Abhishek, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/845,466

(22) Filed: Dec. 18, 2017

(51) Int. Cl.
| | |
|---|---|
| H03K 19/01 | (2006.01) |
| H03K 19/09 | (2006.01) |
| H04B 1/04 | (2006.01) |
| H03K 3/00 | (2006.01) |
| H04L 25/02 | (2006.01) |
| H03K 17/16 | (2006.01) |
| H03K 5/159 | (2006.01) |
| H03K 19/21 | (2006.01) |

(52) U.S. Cl.
CPC ............. *H03K 17/16* (2013.01); *H03K 5/159* (2013.01); *H03K 19/21* (2013.01)

(58) Field of Classification Search
CPC ......... H03K 17/16; H03K 5/159; H03K 19/21
USPC ..... 327/108–112, 379, 389, 391; 326/22–27, 326/81–87
See application file for complete search history.

(56) References Cited

U.S. PATENT DOCUMENTS

| | | | |
|---|---|---|---|
| 6,281,715 B1 * | 8/2001 | DeClue .......... | H03K 19/018528 327/108 |
| 6,288,581 B1 * | 9/2001 | Wong ............. | H03K 5/2481 327/108 |
| 6,437,599 B1 * | 8/2002 | Groen ........... | H03K 19/018585 326/30 |
| 6,590,432 B1 * | 7/2003 | Wu ............... | H04L 25/026 326/83 |
| 6,977,534 B2 * | 12/2005 | Radelinow ...... | H04L 25/0276 326/83 |
| 7,034,574 B1 * | 4/2006 | Li ................. | H04L 25/028 326/83 |
| 7,196,557 B1 | 3/2007 | Kwasniewski et al. | |
| 7,265,587 B1 * | 9/2007 | Ng ................. | H03K 19/01721 326/30 |
| 7,352,211 B1 * | 4/2008 | De Araujo ...... | H04L 25/0286 326/113 |
| 7,579,874 B2 * | 8/2009 | Chen .............. | H04L 25/0272 326/26 |
| 7,940,075 B2 * | 5/2011 | Lee ............... | H04L 25/0272 326/115 |
| 8,155,180 B2 | 4/2012 | Wong et al. | |
| 8,415,986 B2 | 4/2013 | Seth et al. | |

(Continued)

FOREIGN PATENT DOCUMENTS

EP    2387187 A2    11/2011

*Primary Examiner* — Brandon S Cole

(57) ABSTRACT

A low voltage differential signaling (LVDS) driver circuit, system, apparatus, and methodology are provided for controlling switching components in a primary current stage and a pre-emphasis current stage with an adaptive pre-emphasis gain tuning hardware control circuit arranged to provide control signals for periodically tuning a pre-emphasis gain setting for the secondary pre-emphasis current stage by selecting an optimum pre-emphasis gain setting from a plurality of pre-emphasis gain setting which minimizes an inter-symbol interference (ISI) jitter measure for the LVDS driver circuit.

20 Claims, 6 Drawing Sheets

(56) References Cited

U.S. PATENT DOCUMENTS

| | | |
|---|---|---|
| 2004/0124891 A1* | 7/2004 | De Laurentiis ...... H03G 1/0029 |
| | | 327/112 |
| 2008/0116943 A1* | 5/2008 | Nair ............... H03K 19/018528 |
| | | 327/108 |
| 2009/0116564 A1* | 5/2009 | Chen .................. H04L 25/0272 |
| | | 375/257 |
| 2009/0220036 A1 | 9/2009 | Witters et al. |
| 2010/0231266 A1 | 9/2010 | Kishor |
| 2010/0301905 A1 | 12/2010 | Kanda |
| 2011/0299577 A1* | 12/2011 | Tang .................. H03F 3/45183 |
| | | 375/220 |
| 2012/0229214 A1 | 9/2012 | Kasanyal |

* cited by examiner

ON CHIP ADAPTIVE JITTER REDUCTION HARDWARE METHOD FOR LVDS SYSTEMS

BACKGROUND OF THE INVENTION

Field of the Invention

The present invention is directed in general to field of high-speed serial data transmission over transmission lines. In one aspect, the present invention relates generally to a system and method for variable pre-emphasis gain control for reducing inter-symbol interference.

Description of the Related Art

With high speed low voltage differential signaling (LVDS) communications, high speed (e.g., multi-gigabit per second) serial transmission of differential data over two transmission signal lines can be used in a variety of applications (e.g., telecommunication equipment) because of its immunity to crosstalk noise since noise signals shift the ground level voltage and appear as common mode voltages. However, as the number and length of interconnections in high speed telecommunication systems increases, there are signal losses over the transmission line, as well as an increase in inter-symbol interference that results from the attenuation and dispersal of frequency components during signal propagation through a transmission line, resulting in a loss of amplitude of signal pulses and their displacement in time. These effects are exacerbated by the capacitive loading on the transmitter, transmission line, and receiver, especially with high data rate transmit signals having signal levels that change or toggle rapidly. In order to reduce the effects of inter-symbol interference, the transmit data signal that is most susceptible to noise is typically boosted to pre-emphasize the signal prior to transmission so that the signal that is received accurately reproduces the original transmit data signal. At the transmitter, pre-emphasis is accomplished by increasing the current drive only during data transitions to compensate for transmission losses, but this requires control signals that are generated during data transition. And even when using variable gain control techniques to adjust the pre-emphasis so that it is applied only during data transitions, the signal accuracy benefits from choosing a pre-emphasis setting require a tradeoff between poor power consumption performance (resulting from increases to the transmit current drive) and improved jitter performance (resulting from controlling the inter-symbol interference). As seen from the foregoing, the existing pre-emphasis gain control solutions are extremely difficult at a practical level by virtue of the difficulty of balancing the design constraints for providing pre-emphasis to reduce inter-symbol interference jitter with the performance demands for minimizing power consumption. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

An on-chip adaptive pre-emphasis gain tuning hardware circuit, method, and system are described for reducing inter-symbol interference (ISI) jitter by automatically sensing and selecting an optimum pre-emphasis setting to improve performance of an LVDS signaling system. In selected embodiments, the pre-emphasis gain tuning hardware circuit may run at any time during SoC operation to continually monitor and characterize ISI jitter, and then make corresponding adjustments to the pre-emphasis pulse settings so that power consumption is reduced while maintaining jitter performance across a range of PVT conditions. Instead of using complex software, the disclosed adaptive pre-emphasis gain tuning hardware circuit selectively applies pre-emphasis pulsewidth settings based on the ISI-based jitter that is detected on-chip by generating, for each of a plurality of pre-emphasis pulsewidth settings, a jitter pulsewidth measure of a signal transition skew between a clock and a data pulse for comparison to a variable delay measure that is incremented until the variable delay exceeds the jitter pulsewidth measure, at which point the (incremented) variable delay measure is stored with the corresponding pre-emphasis pulsewidth setting. Once (incremented) variable delay measures are determined for each of the plurality of pre-emphasis pulsewidth settings, a controller selects an optimal pre-emphasis setting having the smallest variable delay measure which corresponds to the smallest ISI jitter for the applicable PVT conditions.

Figure 1:
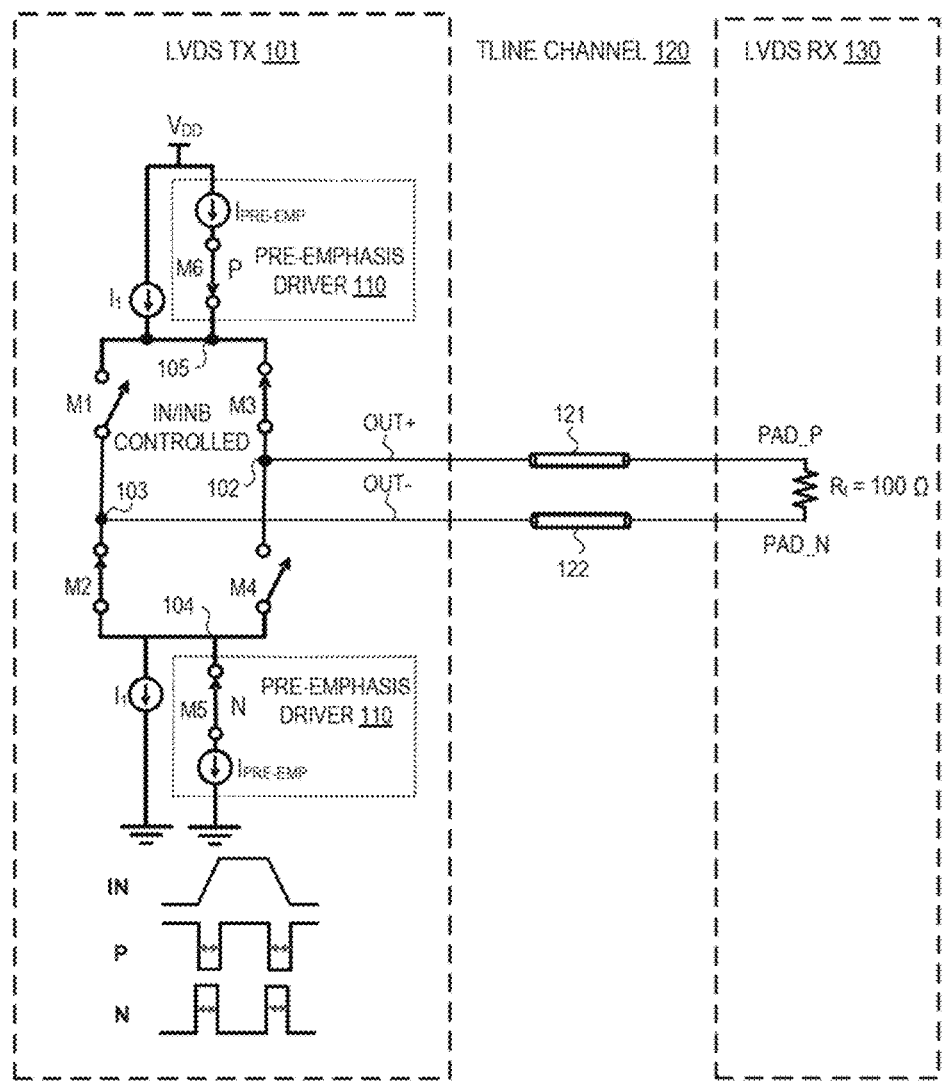
FIG. 1 is a simplified circuit schematic diagram depiction of a conventional low voltage differential signaling (LVDS) system.

To provide a contextual understanding for selected embodiments of the present disclosure, reference is now made to FIG. 1 which depicts a simplified circuit schematic diagram depiction of a conventional low voltage differential signaling (LVDS) system 100 which includes an LVDS transmitter 101, pre-emphasis driver 110, and LVDS receiver 130. At the LVDS transmitter 101, the difference in voltage between the output signals OUT+, OUT− on the output terminals 102, 103 forms the pair of differential signals whose current waveforms are out of phase with one another. The LVDS transmitter 100 includes two n-channel metal oxide semiconductor (NMOS) switches M2, M and two p-channel metal oxide semiconductor (PMOS) switches M1, M3 connected between voltage supply VDD and a direct current (DC) constant current source I1 that is coupled to voltage supply VSS. The four transistor switches M1-M4 are controlled by input voltage signals IN, INB which are typically complementary rail-to-rail voltage swings. With the gates of switches M1 and M2 coupled together to receive input voltage signal IN and the gates of switches M3 and M4 coupled together to receive input voltage signal INB, two of the four switches M1-M4 turn on at a time to steer current from current source I1 to generate a voltage across resistive load R, which switches polarity, depending on whether switches M2 and M3 are turned on or whether switches M1 and M4 are turned on. As a result, a differential output voltage swing can be achieved.

While the LVDS transmitter 101 may operate well at low frequencies, problems arise when the output switching current is limited by DC constant current source I1 or by capacitive loading in the transmitter 101, transmission line channel 120, and/or LVDS receiver 130. In particular, the switching speed of differential LVDS transmitter 101 is proportional to the amount of drive current from current source I1, such limited drive current results in a slow switching speed, which in turn reduces the amplitude of the differential voltage output swing at high frequencies and causes disturbances, such as noise, when LVDS transmitter 101 drives a heavy load, such as a long or a high capacitance transmission line 121-122.

To increase the speed in which the switching takes place, the pre-emphasis driver circuit 110 provides a second or pre-emphasis drive current $I_{PRE-EMP}$ to the LVDS transmitter 101 when the input voltage signals IN, INB change signal states so as to drive additional current, thereby amplifying the difference in voltage between the output signals OUT+, OUT− on the output terminals 102, 103. To this end, the pre-emphasis driver circuit 110 includes an NMOS switch M5 and a PMOS switch M6 connecting, respectively, the terminals 104, 105 over a pre-emphasis current source $I_{PRE-EMP}$ that is coupled to voltage supply VSS and VDD respectively. With the gates of switches M5 and M6 being coupled, respectively, to receive pre-emphasis gate control signals N, P, the switches M5, M6 are turned on to drive additional current direct for the pair of differential signals only during data transitions, thereby compensating for transmission loss.

By applying pre-emphasis variable gain control techniques, the pulsewidths of the pre-emphasis gate control signals N, P can be changed to control the current output from the LVDS transmitter 101 at different levels. For example, with a first setting, the pre-emphasis driver circuit 110 is disabled so that the LVDS transmitter 101 generates a first output current (e.g., 10 mA). However, with a second setting, the pre-emphasis driver circuit 110 generates additional current so that the LVDS transmitter 101 generates a second, stronger output current (e.g., 12 mA). Additional pulsewidth settings can generate additional currents from the pre-emphasis driver circuit 110, such as a third output current (e.g., 14 mA) generated from a third pulsewidth setting and a fourth output current (e.g., 16 mA) generated from a fourth pulsewidth setting. However, conventional approaches for setting the pre-emphasis pulsewidth settings are set without regard to the particular PVT conditions of the LVDS system which can change over time. Thus, a first pre-emphasis setting might add higher pre-emphasis current in order to reduce ISI jitter with device operating at slow-slow (SS) PVT process corner, but this same setting would not be required for another device operating at fast-fast (FF) PVT process corner to achieve required ISI jitter performance, resulting in needless waste of power.

Figure 2:
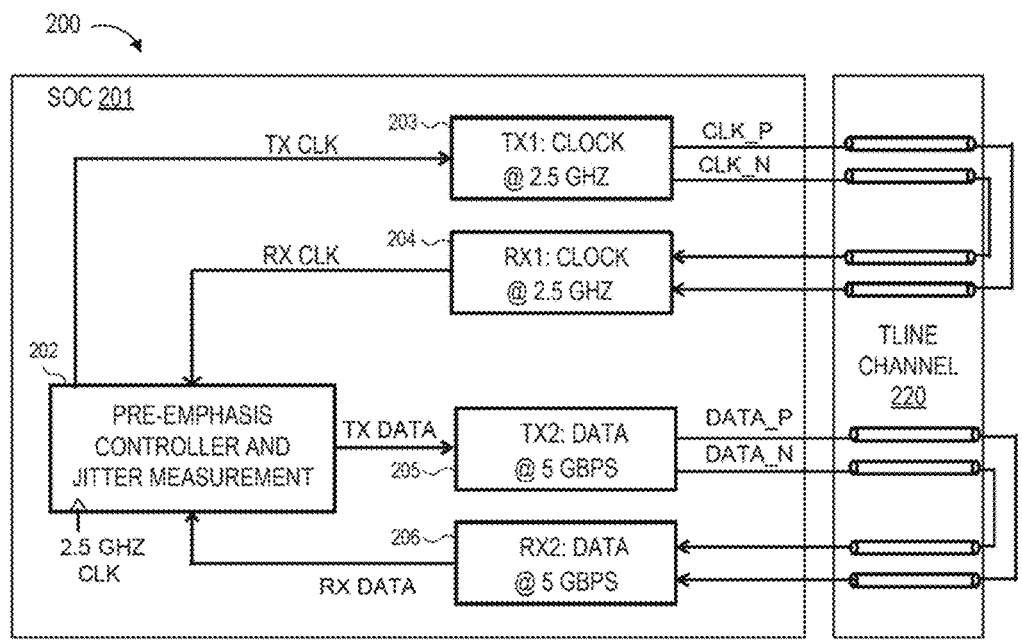
FIG. 2 is a schematic block diagram depiction of an LVDS system with on-chip jitter reduction hardware in accordance with selected embodiments of the present disclosure.

To address these deficiencies and others associated with conventional approaches, reference is now made to FIG. 2 which depicts a schematic block diagram of an LVDS system 200 with on-chip jitter reduction hardware in accordance with selected embodiments of the present disclosure. In this depicted example, the system 200 includes a system-on-chip (SoC) device 201 that is connected in a feedback configuration to a transmission line channel 220 to send and receive clock and data pulse signals under control of a pre-emphasis controller 202. In particular, the pre-emphasis controller 202 is connected to send a transmit clock enable signal (TX_CLK) to enable a first clock transmitter (TX1: CLOCK) 203 to generate differential clock signals CLK_P, CLK_N for feedback transmission over the lossy transmission line channel 220 and reception at the first clock receiver (RX1: CLOCK) 204. In addition, the pre-emphasis controller 202 is connected to send a transmit data pulse enable signal (TX_DATA) to enable a second data transmitter (TX2: DATA) 205 to generate differential data pulse signals DATA_P, DATA_N for feedback transmission over the lossy transmission line channel 220 and reception at the second data receiver (RX2: DATA) 206. Based on the received clock signal (RX_CLK) from the first clock receiver 204 and the received data signal (RX_DATA) from the second data receiver 206, the pre-emphasis controller 202 measures the ISI jitter for a plurality of pre-emphasis settings, and then selects the best pre-emphasis setting that results in most optimum performance of LVDS signaling system 200 based on the on-chip ISI jitter characterization.

Figure 3:
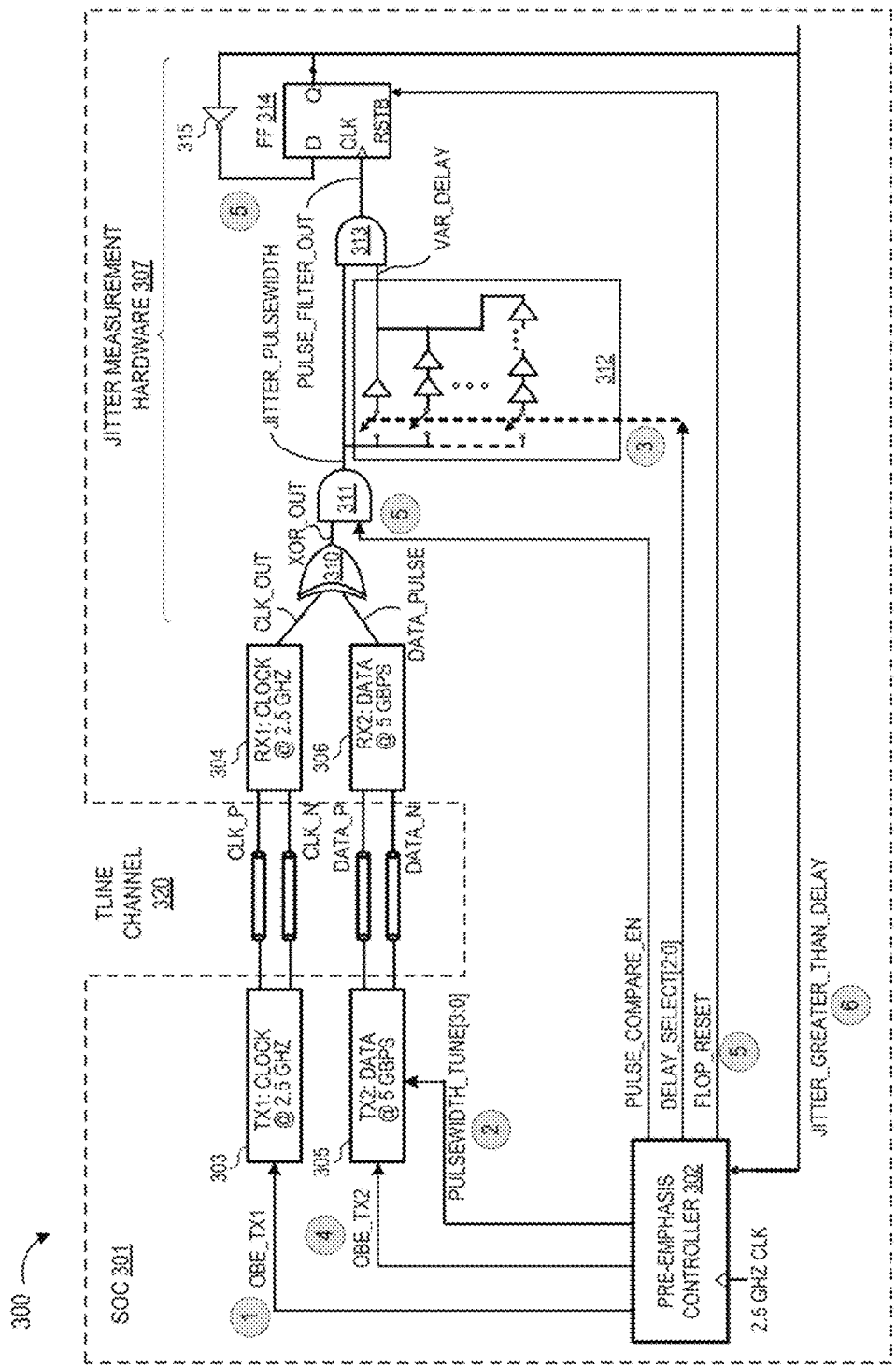
FIG. 3 is a schematic block diagram depiction of on-chip pre-emphasis controller and jitter measurement hardware used in an LVDS system in accordance with selected embodiments of the present disclosure.

To provide additional details for an improved understanding of selected embodiments of the present disclosure, reference is now made to FIG. 3 which depicts a schematic block diagram of an LVDS system 300 with and on-chip pre-emphasis controller 302 and jitter measurement hardware 307 connected in a transmission line loopback path to choose the most appropriate pre-emphasis condition for reducing ISI jitter. In this depicted example, the system 300 includes a system-on-chip (SoC) device 301 that is connected in a loopback configuration to a transmission line channel 320 to send and receive clock and data pulse signals under control of a pre-emphasis controller 302. In particular, the pre-emphasis controller 302 is connected to send a first output buffer enable signal (OBE_TX1) to enable a first clock output buffer (TX1: CLOCK) 303 to generate differential clock signals CLK_P, CLK_N for loopback transmission over the lossy transmission line channel 320 and reception at the first clock input buffer (RX1: CLOCK) 304. In selected embodiments, the pre-emphasis controller 302 determines when the clock is stable and PLL locked before sending the output buffer enable signal (OBE_TX1) to cause the clock output buffer 302 to start sending clock pulses at the SoC clock rate (e.g., 2.5 Ghz).

In addition, the pre-emphasis controller 302 is connected to send a second output buffer enable signal (OBE_TX2) and a pulsewidth tuning signal (PULSEWIDTH_TUNE[3:0]) for controlling a pre-emphasis setting to enable a second data output buffer (TX2: DATA) 305 to generate differential data pulse signals DATA_P, DATA_N for loopback transmission over the lossy transmission line channel 320 and reception at the second data input buffer (RX2: DATA) 306. As disclosed herein, the pre-emphasis controller 302 controls the timing of the second output buffer enable signal (OBE_TX2) so that a single data pulse is output at a specified data transmit rate (e.g., 5 Gbps). By timing the single data pulse to occur after a long stretch of inactivity (while the clock pulses are generated by the clock output buffer 302), the received data pulse signal (DATA_PULSE) at the second data input buffer 306 will have maximum ISI jitter for purposes of jitter measurement. To help reduce the jitter, the pulsewidth tuning signal (PULSEWIDTH_TUNE [3:0]) provided to the second data output buffer (TX2:

DATA) 305 may be variably configured to generate differential data pulse signals DATA_P, DATA_N with one or more pre-emphasis settings for loopback transmission and measurement.

At the jitter measurement hardware circuit 307, the received clock signal (CLK_OUT) from the first input buffer 304 is compared with the received data pulse signal (DATA_PULSE) from the second data input buffer 306 to generate a jitter pulsewidth measure based on the detected signal transition skew between the received clock signal (CLK_OUT) and the received data pulse signal (DATA_PULSE). For example, the jitter pulsewidth measure may be generated with an XOR gate 310 which compares the received clock signal (CLK_OUT) and the received data pulse signal (DATA_PULSE), thereby generating the XOR_OUT signal having a pulsewidth which measures the clock-data skew that represents ISI jitter.

Using a first gating logic circuit (e.g., AND gate 311) that is enabled for pulse comparison by the pre-emphasis controller with a control input signal (e.g., PULSE_COMPARE_EN), the XOR_OUT signal from the XOR gate 310 is output as the gated output signal (JITTER_PULSEWIDTH) to represent the IS jitter associated with the received data pulse. In turn, the gated output signal (JITTER_PULSEWIDTH) is input to second gating circuit (e.g., AND gate 313) which also receives as a second input a delayed version of the gated output signal (VAR_DELAY) that is generated by the variable delay circuit 312. In particular, the variable delay circuit 312 iteratively increments the delay value (VAR_DELAY) in response to the delay select signal (e.g., DELAY_SELECT[2:0]) generated by the pre-emphasis controller 302 for a sequence of comparisons with the gated output signal (JITTER_PULSEWIDTH) at the second gating circuit 313. Each iteration is clocked by the D-type flip-flop 314 which is connected in a toggle configuration by the feedback inverter 315 so that clock input (CLK) from the second gating circuit 313 causes the flip-flop 314 to output a "1" whenever the gated output signal (JITTER_PULSEWIDTH) is greater than the variable delay signal (VAR_DELAY). This iterative clocking incrementation of the variable delay circuit 312 continues until such time as the flip-flop 314 outputs a "0" when the gated output signal (JITTER_PULSEWIDTH) meets or is lesser than the variable delay signal (VAR_DELAY). By enabling the gated output signal (JITTER_PULSEWIDTH) to be compared against a variable delay measure (VAR_DELAY) until a match is detected (or the maximum variable delay measure is generated), the final or matching value of the variable delay measure may be stored to characterize the ISI jitter for a given pre-emphasis setting.

As disclosed herein, the foregoing sequence may be repeated for each of a plurality of pre-emphasis settings. In each sequence, the pre-emphasis controller 302 increments the pulsewidth tuning signal (PULSEWIDTH_TUNE[3:0]) to select the next pre-emphasis setting for the second data output buffer (TX2: DATA) 305 to generate differential data pulse signals DATA_P, DATA_N for loopback transmission. Upon reception at the second data input buffer (RX2: DATA) 306, the data pulse signal (DATA_PULSE) is combined with the received clock signal (CLK_OUT) from the first input buffer 304 at the XOR circuit 310 in order to generate a corresponding jitter pulsewidth measure (JITTER_PULSEWIDTH) that is iteratively compared with the (incremented) variable delay signal (VAR_DELAY) from the variable delay circuit 312 to find the final or matching value of the variable delay measure characterizing the ISI jitter for the each pre-emphasis setting. Once ISI jitter measurements are collected for each of the plurality of pre-emphasis settings, the pre-emphasis controller 302 selects the best pre-emphasis pulsewidth setting based on the minimum variable delay data.

In operation, the disclosed LVDS system 300 has six stages of operation. In a first or starting Stage (1), the first clock output buffer (TX1: CLOCK) 303 is enabled to transmit differential clock pulses signals (CLK_P, CLK_N) once the clock stability is checked. For example, upon confirming that the clock reference enable signal (CREF_EN) and phase look loop lock (PLL_LOCK) signals are both set, the pre-emphasis controller 302 can then send the first output buffer enable signal (OBE_TX1) to allow the clock pad 302 to start transmitting clock signals. The timing of the clock signal transmission is controlled by the pre-emphasis controller 302 which may wait for a specified number of i clock cycles (e.g., i=40) before proceeding to the next stage.

At stage (2), the pre-emphasis controller 302 sets the second data output buffer (TX2: DATA) 305 to an initial or default "no pre-emphasis" setting by sending the pulsewidth tuning signal with a first value (e.g., PULSEWIDTH_TUNE[3:0]=0000) to indicate that there is no pre-emphasis for the issued data pulse. At this time, the pre-emphasis controller 302 may also set a default or minimum value (e.g., DELAY_SELECT[2:0]=000) for the variable delay circuit 312 which is used to measure the signal transition skew between the clock and data lanes (through the XOR gate 310).

At stage (3), the variable delay circuit 312 is set to an initial or non-zero variable delay. For example, the pre-emphasis controller 302 may initialize the variable delay circuit 313 by sending the delay tuning signal with a first value (e.g., DELAY_SELECT[2:0]=001). At the variable delay circuit 312, the delay tuning signal is applied to the switches in the variable delay circuit 312 to connect a first inverter delay path between the first gating logic 311 and the second gating logic 313.

At stage (4), the second data output buffer (TX2: DATA) 305 transmits a single differential data pulse (DATA_P, DATA_N). The timing of the data pulse transmission is controlled by the pre-emphasis controller 302 which may wait for a specified number of j clock cycles (e.g., j=20) before enabling the data pulse to be transmitted by sending the second output buffer enable signal (OBE_TX2) to allow the data pad 305 to send a single data pulse using the current pre-emphasis setting.

At stage (5), the transmitted clock and data pulses are received over the transmission line channel 320 as feedback signals at the first clock input buffer 304 and second data input buffer (RX2: DATA) 306, respectively, as a received clock signal (CLK_OUT) and received data pulse signal (DATA_PULSE). At the XOR gate 310, the received signals are combined to capture a jitter pulsewidth measure as the output (XOR_OUT) which is equivalent to the signal transition delay between clock and data lanes. The delayed transition of the data pulse signal (DATA_PULSE) with respect to the clock signal (CLK_OUT) is the ISI jitter measure that should be minimized by applying the appropriate pre-emphasis settings. If the XOR pulse output from the first gating logic circuit 311 passes through the second gating logic circuit 313 at the same time as the delayed version of the gated output signal (VAR_DELAY), it means that the data ISI jitter is greater than the chosen variable delay. In this case, the pulse (e.g., PULSE_FILTER_OUT) from the second gating logic circuit 313 clocks the D-flip-flop 314 to toggle, with the output being fed back to the pre-emphasis controller 302 with a signal (e.g., JIT- TER_GREATER_THAN_DELAY) to indicate that the variable delay is not enough to mask the pulse. The controller 302 responds by selecting a higher variable delay setting in the delay select signal (e.g., DELAY_SELECT[2:0]) that controls the variable delay circuit 312, and then the processing at stages (4) and (5) are repeated until the variable delay setting is greater than the XOR pulse output. At this time, the D-flip-flop 314 will not see a clock transition and the pre-emphasis controller 302 will then return to Stage (2) to select a new pre-emphasis setting (e.g., PULSEWIDTH_TUNE[3:0]=(0001). By then repeating the processing at stages (3)-(5) for each new pre-emphasis setting until all pre-emphasis settings have been evaluated, a set of delay settings and pre-emphasis settings are collected.

At stage (6), once the final variable delay settings for each pre-emphasis condition are stored, the pre-emphasis controller 302 determines the optimal pre-emphasis setting for application to the first clock output buffer 303 and second data output buffer 305. This determination may be made by selecting the pre-emphasis setting which has the smallest final variable delay setting. As a result of this process, an SoC 301 operating in process, voltage and temperature (PVT) silicon conditions characterized by a fast-fast (FF) process corner (where both the PMOS transistor and NMOS transistors are fast) may have minimal data ISI jitter, in which case "no pre-emphasis" is selected as the optimal pre-emphasis setting. However, for an SoC 301 operating in PVT silicon conditions characterized by a slow-slow (SS) process corner (where both the PMOS transistor and NMOS transistors are slow) may have significant data ISI jitter, in which case a higher pre-emphasis setting may be selected as the optimal pre-emphasis setting.

As a result of the six operation stages (1)-(6), SoC devices 301 characterized by different PVT conditions (e.g., process and temperature) will be evaluated by the on-chip pre-emphasis controller 302 and jitter measurement hardware 307 to select an optimum pre-emphasis gain setting. As illustrated in the table below, the selected pre-emphasis gain setting is represented by the pulsewidth tuning signal (PULSEWIDTH_TUNE) that is applied when the final variable delay setting (DELAY_SELECT[2:0]) is applied to set the flip-flop output when the gated output signal (JITTER_PULSEWIDTH) is less than the variable delay measure (VAR_DELAY).

| Process | Temp | Pulsewidth_Tune | Pre-emphasis Gain | TX Current |
| --- | --- | --- | --- | --- |
| 4σ FF | −40° C. | 0001 | No pre-emphasis | 18 mA |
| 4σ FF | 150° C. | 0010 | 1 dB | 22 mA |
| Typical | −40° C. | 0010 | 1 dB | 22 mA |
| Typical | 150° C. | 0100 | 2 dB | 26 mA |
| 4σ SS | −40° C. | 1000 | 3 dB | 30 mA |
| 4σ SS | 150° C. | 1000 | 3 dB | 30 mA |

As illustrated above, a first "no pre-emphasis" gain setting (indicated with PULSEWIDTH_TUNE[3:0]=0001) that is selected for a first SoC device operating at a first FF corner (e.g., 4σ FF, −40° C.) will control the output buffers 302, 305 to use first, low transmission current (e.g., 18 mA) when the process conditions are least susceptible to ISI jitter. However, for SoC devices operating in process conditions that are more susceptible to ISI jitter, such as a second FF corner (e.g., 4σ FF, 150° C.) or under more typical operating conditions (e.g., Typical, −40° C.), a second pre-emphasis gain setting (indicated with PULSEWIDTH_TUNE[3:0]=0010) could be selected to provide a first increment of pre-emphasis gain (e.g., 1 dB) so that the output buffers 302, 305 use more transmission current (e.g., 22 mA). In similar fashion, a third pre-emphasis gain setting (indicated with PULSEWIDTH_TUNE[3:0]=0100) could be selected for an SoC device operating at operating conditions that are more susceptible to ISI jitter (e.g., Typical, 150° C.) to provide a second increment of pre-emphasis gain (e.g., 2 dB) to the output buffers 302, 305 to use more transmission current (e.g., 26 mA). Finally, SoC devices operating in process conditions that are most susceptible to ISI jitter, such as a SS corners (e.g., 4σ SS, −40° C. or 150° C.), a third pre-emphasis gain setting (indicated with PULSEWIDTH_TUNE[3:0]=1000) could be selected to provide a third increment of pre-emphasis gain (e.g., 3 dB) so that the output buffers 302, 305 use more transmission current (e.g., 30 mA).

Figure 4A:
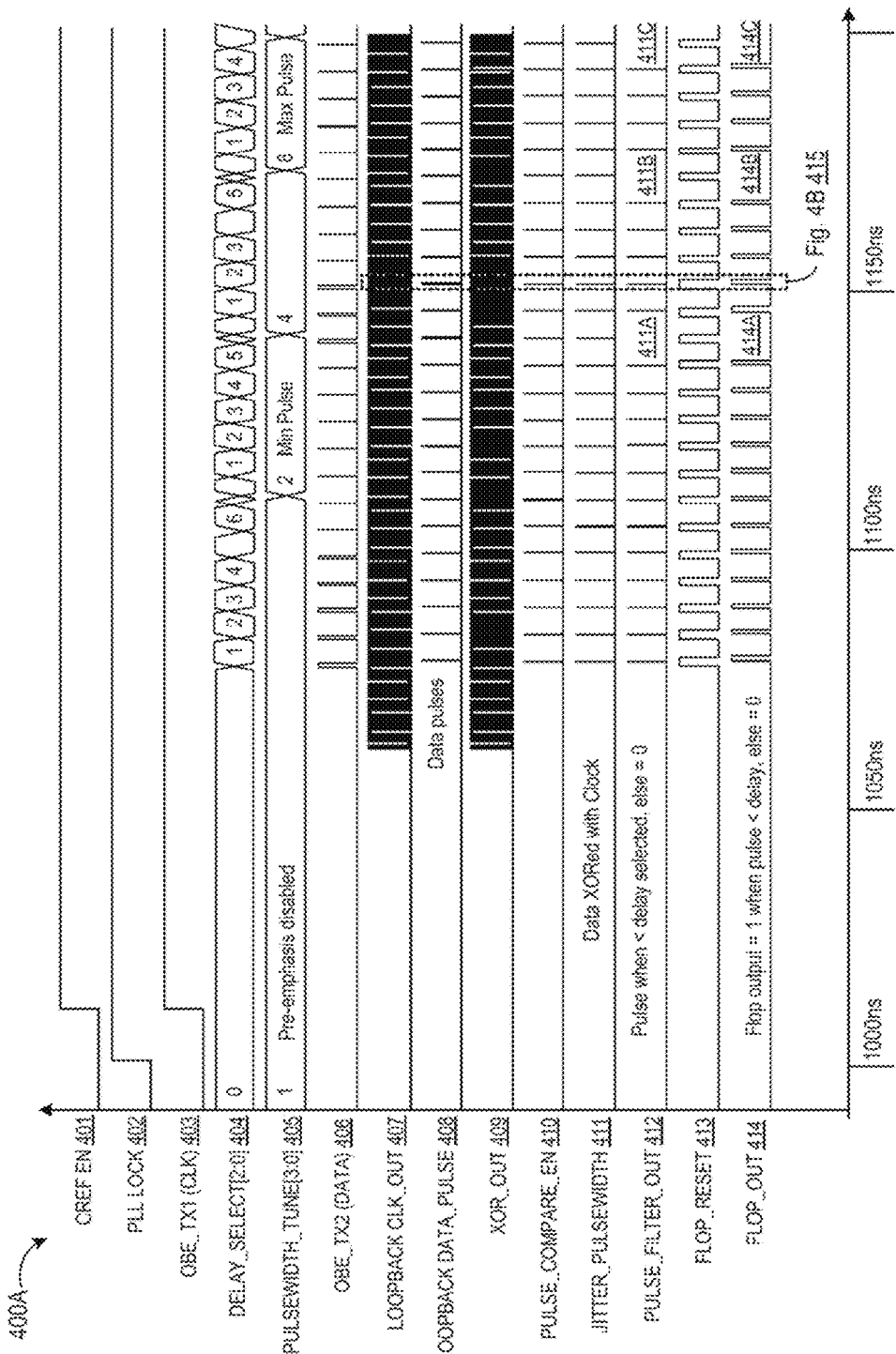
FIGS. 4A-B show simulated timing diagrams for selected signals in the pre-emphasis controller and jitter measurement hardware shown in FIG. 3.

To provide additional details for an improved understanding of selected embodiments of the present disclosure, reference is now made to FIG. 4A which shows simulated timing diagrams 400A for selected signals 401-414 in the pre-emphasis controller and jitter measurement hardware shown in FIG. 3. In particular, the controller 302 initializes the system by resetting all tuning signals (e.g., PULSEWIDTH_TUNE[3:0] and DELAY_SELECT[2:0]) and enabling the loopback communication from the jitter measurement hardware 307. Upon setting the clock reference enable signal (CREF_EN) 401 and phase look loop lock (PLL_LOCK) signal 402, the controller checks that the clock is stable before setting the first output buffer enable signal (OBE_TX1) 403 to enable the first clock output buffer 303 to begin transmitting a clock signal CLK_P, CLK_N over the transmission line channel 320. After waiting for a specified number of i clock cycles (e.g., i=40) before proceeding to the next stage, the controller 302 applies the initialized variable delay setting signal 404 (DELAY_SELECT[2:0]=0) to set the variable delay circuit 312 to a first delay value. In addition, the controller 302 applies the initialized pre-emphasis gain setting signal 405 (PULSEWIDTH_TUNE[3:0]=0) to control the second data output buffer 305 to begin transmitting single data pulses 406.

Figure 4B:
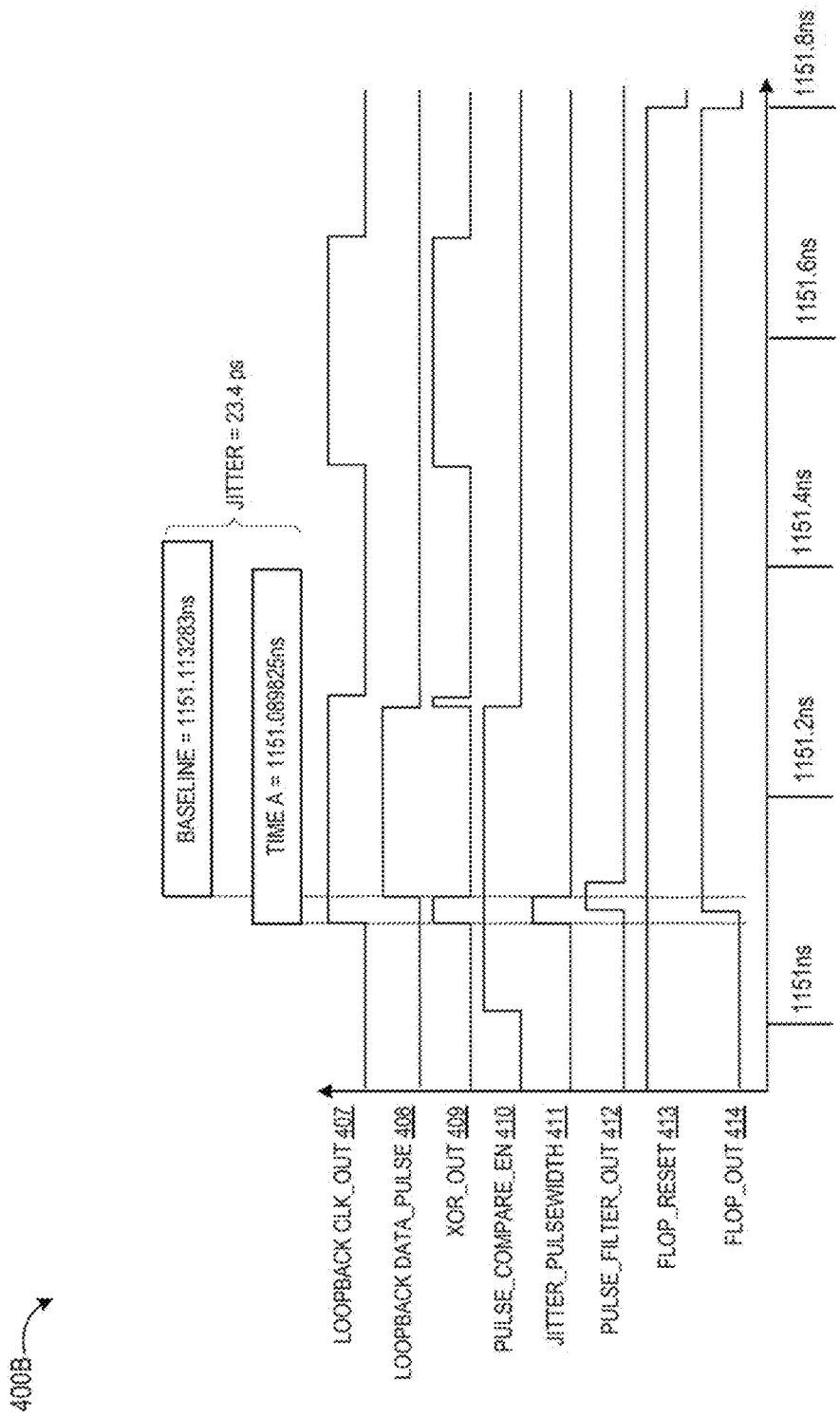

As the transmitted clock and data pulse signals are received at the input buffers 304, 306, respectively, as loopback clock signal 407 (CLK_OUT) and loopback data signal 408 (DATA_PULSE), they are applied to the XOR circuit 310 which generates a corresponding jitter pulsewidth measure 409 (XOR_OUT) from the detected signal transition skew between the loopback clock and data signals 407, 408. In enlarged portion 415 shown in FIG. 4B, the signal transition skew between the time when the loopback clock signal 407 goes high (e.g., Time A=1151.089825 ns) and the time when the loopback data signal 408 goes high (e.g., Baseline=1151.113283 ns) is 23.4 ps. When enabled by the control input comparison enable signal 410 (e.g., PULSE_COMPARE_EN), the XOR_OUT signal from the XOR gate 310 is output from the first gating logic 311 as the gated output signal 411 (JITTER_PULSEWIDTH) to represent the ISI jitter associated with the received data pulse. By using the second gating logic circuit 313 to combine the gated output signal 411 (JITTER_PULSEWIDTH) with the variable delay setting signal 404 (DELAY_SELECT[2:0]=0) from the variable delay circuit 312, the output pulse signal 412 will include a pulse only when the gated output signal 411 (JITTER_PULSEWIDTH) is larger than the variable delay setting signal 404, and is otherwise set to "0". However, when the gated output signal 411 (JITTER_PULSEWIDTH) is lower than the variable delay setting signal 404, then the output pulse signal 412 will not include a pulse, as indicated at 411A, 411B, 411C. Through the flip-flop reset action provided by the flop reset signal 413 (FLOP_RESET), the D-flip-flop output signal 414 (FLOP_OUT) will also set the flop-flop output to "1" whenever the gated output signal 411 (JITTER_PULSEWIDTH) is larger than the variable delay setting signal 404, but will otherwise reset the flip-flop output to "0" when the gated output signal 411 (JITTER_PULSE WIDTH) is less than the variable delay setting signal 404, as indicated at 414A, 414B, 414C.

In the simulated timing diagrams shown in FIG. 4A, an example slow SoC device is being evaluated is operating under a slow, 1.7V, 150° C. worst case scenario (WCS) corner condition having significant data ISI jitter. In this example, the number of pulses in the flip-flop output signal 414 (FLOP_OUT) during each of the pulsewidth tuning signal settings (PULSEWIDTH_TUNE[3:0]) will denote the amount of data ISI jitter at said setting. For example, during the initial "no pre-emphasis" pulsewidth tuning signal setting (PULSEWIDTH_TUNE[3:0]=0001), there are 7 detected pulses in the flip-flop output signal 414 (FLOP_OUT), indicating that significant ISI jitter when no pre-emphasis is provided. However, during the second pre-emphasis pulsewidth tuning signal setting (PULSEWIDTH_TUNE[3:0]=0010), there are 5 detected pulses in the flip-flop output signal 414 (FLOP_OUT), and during the third pre-emphasis pulsewidth tuning signal setting (PULSEWIDTH_TUNE[3:0]=0100), there are 5 detected pulses in the flip-flop output signal 414 (FLOP_OUT). Finally, during the fourth pre-emphasis pulsewidth tuning signal setting (PULSEWIDTH_TUNE[3:0]=1000), there are 4 detected pulses in the flip-flop output signal 414 (FLOP_OUT). As a result, the fourth pre-emphasis pulsewidth tuning signal setting (e.g., 4'b1000) is selected to minimize the data IS jitter.

Figure 5:
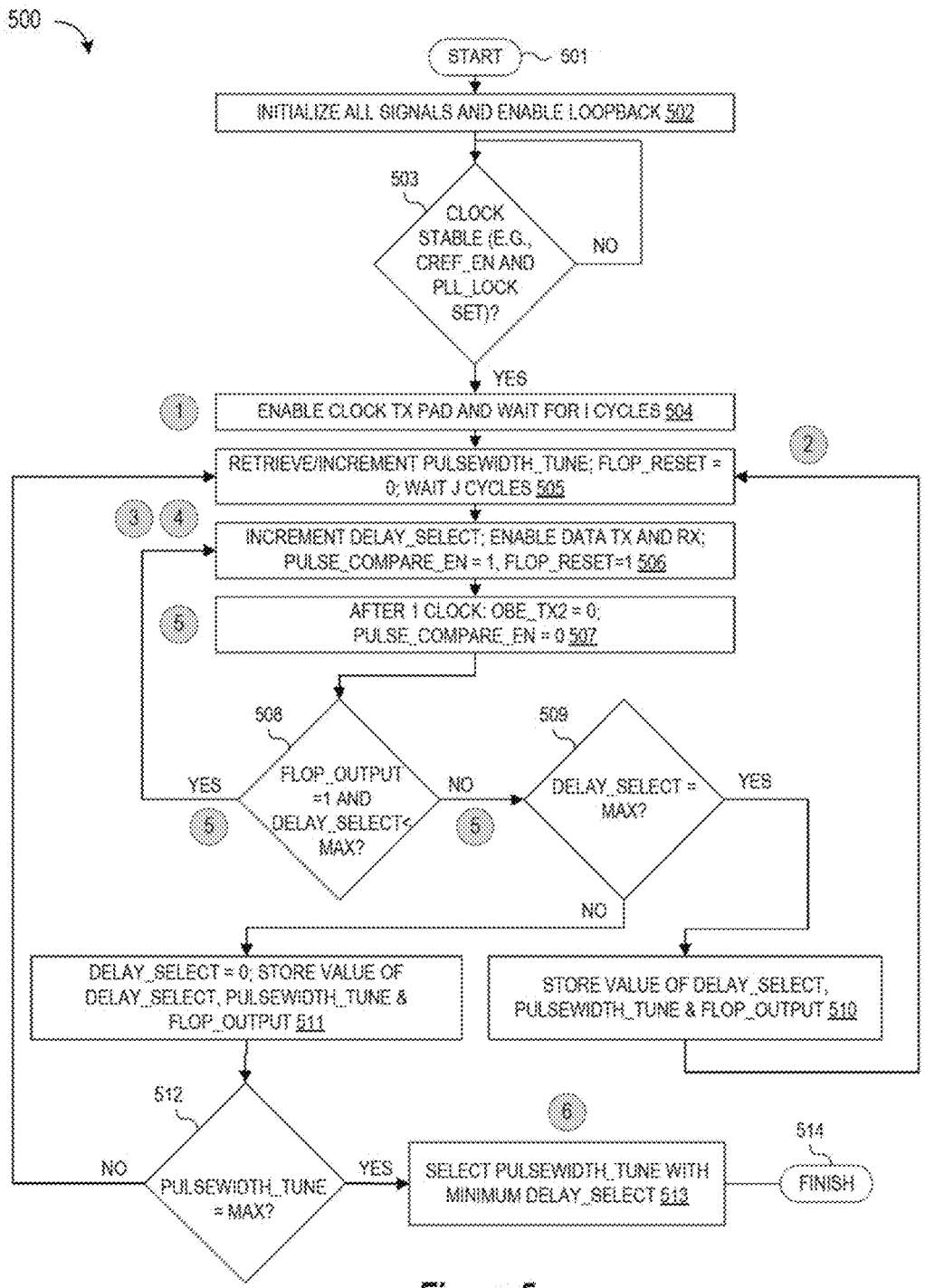
FIG. 5 illustrates a simplified state diagram flow chart showing an example sequence for determining an optimum pre-emphasis gain across process, voltage and temperature (PVT) corners to satisfy inter-symbol interference jitter specifications in accordance with selected embodiments of the present disclosure.

To provide additional details for an improved understanding of selected embodiments of the present disclosure, reference is now made to FIG. 5 which depicts a simplified state diagram flow chart 500 showing an example sequence for determining an optimum pre-emphasis gain across PVT corners to satisfy inter-symbol interference jitter specifications in accordance with selected embodiments of the present disclosure. In an example embodiment, the state diagram flow sequence shown in FIG. 5 may be implemented on-chip with adaptive pre-emphasis gain tuning hardware that includes a hardware controller and jitter measurement circuit connected in a loopback configuration to evaluate a data pulse signal sent under different pre-emphasis settings against a clock signal for purposes of generating a jitter pulsewidth measure of the signal transition skew between the clock and data pulse signals for comparison to a variable delay measure in order characterize the data ISI jitter.

In exemplary embodiments of the state diagram flow sequence, the process starts (step 501) so that the system signals are initialized and loopback connection of the received data and clock signals is enabled (step 502). At step 503, the clock stability is checked before enabling the pre-emphasis controller. For example, the clock reference enable signal (CREF_EN) and phase lock loop lock (PLL_LOCK) signals are both checked as indicators of clock stability. If they are not both set (negative outcome to detection step 503), then the process waits.

However, when the clock stability is confirmed (affirmative outcome to detection step 503), clock transmit pad is enabled at step 504 to start transmitting clock signals as a first operation state (1) for the process. For example, the pre-emphasis controller can enable the clock transmit pad by sending the first output buffer enable signal (OBE_TX1) and then waiting for a specified number of i clock cycles (e.g., i=40) before proceeding.

At step 505, the process retrieves the initial pulsewidth tuning signal which will be applied during a first iteration of the second operation state (2) so that there is no pre-emphasis for the generated data pulse. For example, the pre-emphasis controller can retrieve an initialized pulsewidth tuning signal having a first value (e.g., PULSEWIDTH_TUNE[3:0]=0000), and then reset the D-flip-flop (e.g., FLIP_RESET=0) and wait for a specified number of j clock cycles (e.g., j=20) before proceeding.

At step 506, the process increments the initial default or minimum delay value which controls the variable delay circuit 312 (operation state 3) and also enables the data transmit pad to generate a single pulse (operation state 4) which will be applied during a first iterative comparison of the pulsewidth tuning signal and the incremented delay value. For example, the pre-emphasis controller can enable the data transmit and receive pads 303, 305 to be able to send and receive a data pulse. In addition, the pre-emphasis controller can set the control input comparison enable signal (e.g., PULSE_COMPARE_EN=1) which enables the first gating circuit 311 to capture the XOR gate 310 output measure of the signal transition skew between the clock and data lanes. Finally, the pre-emphasis controller can set the flop reset signal (FLOP_RESET=1) to reset the flip-flop 314 so that it is ready to detect any pulses from the second gating circuit 313.

At step 507, the data transmit pad and first gating circuit are disabled after a single clock pulse as part of operation state (5) so that only a single data pulse is transmitted. For example, the pre-emphasis controller can disable the data transmit pad 303 by resetting the second output buffer enable signal (OBE_TX2=0). In addition, the pre-emphasis controller can reset the control input comparison enable signal (e.g., PULSE_COMPARE_EN=0) to disable the first gating circuit 311.

At detection steps 508 and 509, the flip-flop output and delay select signals are checked as part of operation state (5) to determine if the delay select signal should be incremented for one or more additional iterative passes through steps 506-507 or otherwise stored before moving to the next pre-emphasis setting. In particular, the pre-emphasis controller implements detection step 508 by checking if the flop output signal is set (e.g., FLOP_OUT=1) and if the delay select signal is less than the maximum value (e.g., DELAY_SELECT[2:0]<111). If both conditions are true (affirmative outcome to detection step 508), then this indicates that the variable delay measure should be incremented and compared against the gated output signal (JITTER_PULSEWIDTH) by repeating steps 506-508 until either of the conditions are not true (negative outcome to detection step 508), at which time the process proceeds to detection step 509 when the pre-emphasis controller checks if the delay select signal has reached its maximum value (e.g., DELAY_SELECT[2:0]=111).

If the maximum delay value for a given pre-emphasis setting is reached (affirmative outcome to detection step 509), then the pre-emphasis controller performs step 510 by storing the delay select signal value (e.g., DELAY_SELECT[2:0]=111) with the current pre-emphasis setting (e.g., PULSEWIDTH_TUNE[3:0]=0001). After step 510, the process returns to perform an additional iterative pass of steps 505-509 in which the pre-emphasis setting is incremented (e.g., PULSEWIDTH_TUNE[3:0]=0010). Steps 505-509 are repeated for each pre-emphasis setting until the flop output signal is reset (e.g., FLOP_OUT=0), as indicated by a negative outcome to detection step 509), at which time the pre-emphasis controller performs step 511 by storing the delay select value (DELAY_SELECT[2:0]) and then resetting the delay select to 0 for the next iteration 512.

At step 512, the pre-emphasis controller determines if the maximum pre-emphasis setting has been reached (e.g., PULSEWIDTH_TUNE[3:0]=1000). If not (negative outcome to detection step 512), the process returns to perform an additional iterative pass of steps 505-509 in which the pre-emphasis setting is incremented (e.g., PULSEWIDTH_TUNE[3:0]).

Once the maximum pre-emphasis setting is reached (affirmative outcome to detection step 512), then the final variable delay settings stored for each pre-emphasis condition are evaluated at step 513 to select the pre-emphasis setting which has the smallest final variable delay setting as part of operation state (5). At step 514, the process ends.

By now it should be appreciated that there has been provided a low voltage differential signaling (LVDS) driver circuit, system, apparatus, and methodology in which the pre-emphasis gain settings are periodically tuned by selecting an optimum pre-emphasis gain setting which minimizes an inter-symbol interference (ISI) jitter measure for the LVDS driver circuit. In the disclosed embodiments, the LVDS driver circuit includes a primary stage having first switching component arranged to provide a first output current in response to first control signals, and also includes a secondary pre-emphasis stage having second switching component arranged to provide a second output current in response to second control signals specifying a pre-emphasis gain setting. The disclosed LVDS driver circuit also includes an adaptive pre-emphasis gain tuning hardware control circuit arranged to provide said first and second control signals for controlling said first and second switching components, characterized in that said adaptive pre-emphasis gain tuning hardware control circuit periodically tunes the pre-emphasis gain setting for the secondary pre-emphasis stage by selecting an optimum pre-emphasis gain setting which minimizes an inter-symbol interference (ISI) jitter measure for the LVDS driver circuit. In selected embodiments, the LVDS driver circuit is embodied in single integrated circuit chip. In other embodiments, the adaptive pre-emphasis gain tuning hardware control circuit may include a clock transmit pad connected over a first transmission channel in a clock loopback configuration to a clock receiver pad; a data transmit pad connected over a second transmission channel in a data loopback configuration to a data receiver pad; a pre-emphasis controller connected to control transmission of a clock signal from the clock transmit pad and to control concurrent transmission of a single data pulse from the data transmit pad using an adjustable pre-emphasis setting for the data transmit pad; and a jitter measurement hardware circuit connected to the clock receive pad and data receiver pad to detect a jitter pulsewidth measure of a signal transition skew between a received clock signal pulse and a received single data pulse and to compare the jitter pulsewidth measure to a variable delay measure that is incremented until the variable delay measure exceeds the jitter pulsewidth measure. In such embodiments, the jitter measurement hardware circuit may include an XOR gate connected to compare the received clock signal pulse and received single data pulse when generating the jitter pulsewidth measure. In addition, the jitter measurement hardware circuit may include a variable delay circuit connected to generate the variable delay measure by connecting the jitter pulsewidth measure across a delay path selected by the pre-emphasis controller. In addition, the jitter measurement hardware circuit may include a gating circuit connected to compare the jitter pulsewidth measure with the variable delay measure when generating an output pulse signal; and a toggle flip-flop connected to generate a first output to the pre-emphasis controller when the output pulse signal indicates that the jitter pulsewidth measure is greater than the variable delay measure and to generate a second output to the pre-emphasis controller when the output pulse signal indicates that the jitter pulsewidth measure is less than the variable delay measure. In addition, the adaptive pre-emphasis gain tuning hardware control circuit may periodically tune the pre-emphasis gain setting for the secondary pre-emphasis stage by generating, for each selected pre-emphasis gain setting from a plurality of pre-emphasis gain settings, a jitter pulsewidth measure of a signal transition skew between a clock and a data pulse sent with the selected pre-emphasis gain setting; and then comparing a jitter pulsewidth measure to a variable delay measure that is incremented until the variable delay measure exceeds the jitter pulsewidth measure, at which point the variable delay measure is stored with the corresponding selected pre-emphasis gain setting. Once the measured values are stored, the optimum pre-emphasis gain setting may be selected by identifying the selected pre-emphasis gain setting which having the smallest variable delay measure. Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art. Although the described exemplary embodiments disclosed herein are directed to an exemplary on-chip with adaptive pre-emphasis gain tuning hardware, the present invention is not necessarily limited to the example embodiments illustrate herein, and various embodiments of the circuitry and methods disclosed herein may be implemented with other devices and software components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

In another form, there is provided a method, system and apparatus for adaptively controlling pre-emphasis gain in a low voltage differential signaling (LVDS) driver circuit. In the disclosed embodiments, a clock signal is generated for transmission over a loopback path to be received as a clock signal at a clock receiver. In selected embodiments, the clock signal is generated by transmitting the clock signal from a clock transmit pad connected over a first transmission channel in a clock loopback configuration to a clock receiver pad. And for each of a plurality of adjustable pre-emphasis settings, data signal pulses are generated for transmission over a loopback path to a data receiver. In selected embodiments, the data signal pulses are generated by transmitting, for each of a plurality of adjustable pre-emphasis settings, the plurality of data signal pulses from a data transmit pad connected over a second transmission channel in a data loopback configuration to a data receiver pad. For each of the plurality of adjustable pre-emphasis settings, a jitter pulsewidth measure of a signal transition skew between a received clock signal and a received data pulse is detected by comparing the jitter pulsewidth measure to a variable delay measure that is incremented until a final incremented delay measure exceeds the jitter pulsewidth measure. In selected embodiments, the jitter pulsewidth measure is detected by connecting a received clock signal pulse and a received single data pulse as inputs to an XOR gate to generate the jitter pulsewidth measure as an XOR gate output. In other embodiments, the variable delay measure is incremented by connecting the jitter pulsewidth measure across a plurality of delay paths in a variable delay circuit for each of the plurality of adjustable pre-emphasis settings. In such embodiments, the jitter pulsewidth measure for each of a plurality of adjustable pre-emphasis settings may be detected by connecting the XOR gate output and the variable delay measure as inputs to a gating circuit to generate an output pulse signal which is connected to clock a toggle flip-flop connected to generate a first output when the output pulse signal indicates that the jitter pulsewidth measure is greater than the variable delay measure and to generate a second output when the output pulse signal indicates that the jitter pulsewidth measure is less than the variable delay measure. Finally, an optimum pre-emphasis gain setting is selected from the plurality of adjustable pre-emphasis settings which has a minimal final incremented variable delay measure. In selected embodiments, the steps are periodically performed by hardware circuitry embodied in a single integrated circuit chip to continually monitor and characterize ISI jitter during operation of the chip and make corresponding adjustments to the optimum pre-emphasis gain setting to reduce power consumption while maintaining jitter performance across a range of operating conditions.

In yet another form, there is provided a line driver circuit, method, system, and apparatus with on-chip adaptive jitter reduction hardware that provides a differential signal to an external circuit. In the disclosed embodiments, a current steering circuit having first and second output nodes is configured to couple first and second output drive currents to an external circuit in response to one or more input drive currents. In addition, a current source is coupled to the current steering circuit and configured to provide a first input drive current to the current steering circuit in response to first control signals. In addition, a pre-emphasis circuit is coupled to the current steering circuit and configured to receive an input signal switching between first and second signal states, and in accordance therewith provide a second input drive current to the current steering circuit in response to second control signals specifying a pre-emphasis gain setting. Finally, an adaptive pre-emphasis gain tuning hardware control circuit having a pre-emphasis controller and jitter measurement hardware circuit is arranged to provide said first and second control signals for controlling said current source and pre-emphasis circuit, characterized in that said adaptive pre-emphasis gain tuning hardware control circuit periodically tunes the pre-emphasis gain setting for the pre-emphasis circuit by selecting an optimum pre-emphasis gain setting which minimizes an inter-symbol interference (ISI) jitter measure for the line driver circuit. In selected embodiments, the adaptive pre-emphasis gain tuning hardware control circuit is configured to generate a clock signal for transmission over a loopback path to be received as a clock signal at a clock receiver; generate, for each of a plurality of adjustable pre-emphasis settings, a plurality of data signal pulses using one of the plurality of adjustable pre-emphasis settings for transmission over a loopback path to a data receiver, detect, for each of a plurality of adjustable pre-emphasis settings, a jitter pulsewidth measure of a signal transition skew between a received clock signal and a received data pulse by comparing the jitter pulsewidth measure to a variable delay measure that is incremented until a final incremented delay measure exceeds the jitter pulsewidth measure; and select an optimum pre-emphasis gain setting from the plurality of adjustable pre-emphasis settings which has a minimal final incremented variable delay measure. In addition, the current steering circuit, current source, pre-emphasis circuit, and adaptive pre-emphasis gain tuning hardware control circuit may be embodied in a single integrated circuit chip. Thus embodied, the adaptive pre-emphasis gain tuning hardware control circuit periodically monitors ISI jitter to make corresponding adjustments to the optimum pre-emphasis gain setting to reduce power consumption while maintaining jitter performance across a range of operating conditions. For example, the adaptive pre-emphasis gain tuning hardware control circuit may be configured to periodically tune the pre-emphasis gain setting for the pre-emphasis circuit by generating, for each selected pre-emphasis gain setting from a plurality of pre-emphasis gain settings, a jitter pulsewidth measure of a signal transition skew between a clock and a data pulse sent with the selected pre-emphasis gain setting; and comparing a jitter pulsewidth measure to a variable delay measure that is incremented until the variable delay measure exceeds the jitter pulsewidth measure, at which point the variable delay measure is stored with the corresponding selected pre-emphasis gain setting; where selecting the optimum pre-emphasis gain setting comprises identifying the selected pre-emphasis gain setting which having the smallest variable delay measure.

The description of the example embodiments set forth herein is provided to portray various features and aspects in the context of an exemplary application. After reading this description, it will become apparent to one of ordinary skill in the art how the present disclosure can be implemented in different and alternative environments. Unless defined otherwise, all technical and scientific terms used herein have the same meaning as is commonly understood by one of ordinary skill in the art. Thus, the present description is presented to enable a person skilled in the art to make and use the invention. The general principles described herein may be applied to embodiments and applications other than those detailed herein without departing from the spirit and scope of the invention as defined by the appended claims. Thus, while a particular feature of the invention may have been disclosed with respect to only one of several embodiments, such feature may be combined with one or more other features of the other embodiments as may be desired. It is therefore, contemplated that the claims will cover any such modifications or embodiments that fall within the true scope of the invention.

The various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof: the terms "a" or "an" should be read as meaning "at least one", "one or more" or the like; and adjectives such as "conventional", "traditional", "normal", "standard", "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more", "at least", "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed across multiple locations. Unless stated otherwise, terms such as "first" and "second" are used to arbitrarily distinguish between the elements such terms describe. Thus, these terms are not necessarily intended to indicate temporal or other prioritization of such elements.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A low voltage differential signaling (LVDS) driver circuit, comprising:
   a primary stage having first switching component arranged to provide a first output current in response to first control signals;
   a secondary pre-emphasis stage having second switching component arranged to provide a second output current in response to second control signals specifying a pre-emphasis gain setting; and
   an adaptive pre-emphasis gain tuning hardware control circuit arranged to provide said first and second control signals for controlling said first and second switching components, characterized in that said adaptive pre-emphasis gain tuning hardware control circuit periodically tunes the pre-emphasis gain setting for the secondary pre-emphasis stage by selecting an optimum pre-emphasis gain setting which minimizes an inter-symbol interference (ISI) jitter measure for the LVDS driver circuit, wherein the adaptive pre-emphasis gain tuning hardware control circuit periodically tunes the pre-emphasis gain setting for the secondary pre-emphasis stage by:
   generating, for each selected pre-emphasis gain setting from a plurality of pre-emphasis gain settings, a jitter pulsewidth measure of a signal transition skew between a clock and a data pulse sent with the selected pre-emphasis gain setting; and
   comparing a jitter pulsewidth measure to a variable delay measure that is incremented until the variable delay measure exceeds the jitter pulsewidth measure, at which point the variable delay measure is stored with the corresponding selected pre-emphasis gain setting;
   where selecting the optimum pre-emphasis gain setting comprises identifying the selected pre-emphasis gain setting which having the smallest variable delay measure.

2. The LVDS driver circuit of claim 1, where the LVDS driver circuit is embodied in a single integrated circuit chip.

3. A low voltage differential signaling (LVDS) driver circuit, comprising:

a primary stage having first switching component arranged to provide a first output current in response to first control signals;

a secondary pre-emphasis stage having second switching component arranged to provide a second output current in response to second control signals specifying a pre-emphasis gain setting; and an adaptive pre-emphasis gain tuning hardware control circuit arranged to provide said first and second control signals for controlling said first and second switching components, characterized in that said adaptive pre-emphasis gain tuning hardware control circuit periodically tunes the pre-emphasis gain setting for the secondary pre-emphasis stage by selecting an optimum pre-emphasis gain setting which minimizes an inter-symbol interference (ISI) jitter measure for the LVDS driver circuit, wherein the adaptive pre-emphasis gain tuning hardware control circuit comprises:

a clock transmit pad connected over a first transmission channel in a clock loopback configuration to a clock receiver pad;

a data transmit pad connected over a second transmission channel in a data loopback configuration to a data receiver pad;

a pre-emphasis controller connected to control transmission of a clock signal from the clock transmit pad and to control concurrent transmission of a single data pulse from the data transmit pad using an adjustable pre-emphasis setting for the data transmit pad; and a jitter measurement hardware circuit connected to the clock receive pad and data receiver pad to detect a jitter pulsewidth measure of a signal transition skew between a received clock signal pulse and a received single data pulse and to compare the jitter pulsewidth measure to a variable delay measure that is incremented until the variable delay measure exceeds the jitter pulsewidth measure.

4. The LVDS driver circuit of claim 3, where the jitter measurement hardware circuit comprises an XOR gate connected to compare the received clock signal pulse and received single data pulse when generating the jitter pulsewidth measure.

5. The LVDS driver circuit of claim 3, where the jitter measurement hardware circuit comprises a variable delay circuit connected to generate the variable delay measure by connecting the jitter pulsewidth measure across a delay path selected by the pre-emphasis controller.

6. The LVDS driver circuit of claim 3, where the jitter measurement hardware circuit comprises:

a gating circuit connected to compare the jitter pulsewidth measure with the variable delay measure when generating an output pulse signal; and a toggle flip-flop connected to generate a first output to the pre-emphasis controller when the output pulse signal indicates that the jitter pulsewidth measure is greater than the variable delay measure and to generate a second output to the pre-emphasis controller when the output pulse signal indicates that the jitter pulsewidth measure is less than the variable delay measure.

7. The LVDS driver circuit of claim 3, where the LVDS driver circuit is embodied in a single integrated circuit chip.

8. A method for adaptively controlling pre-emphasis gain in a low voltage differential signaling (LVDS) driver circuit, comprising:

generating a clock signal for transmission over a loopback path to be received as a clock signal at a clock receiver;

generating, for each of a plurality of adjustable pre-emphasis settings, a plurality of data signal pulses using one of the plurality of adjustable pre-emphasis settings for transmission over a loopback path to a data receiver;

detecting, for each of a plurality of adjustable pre-emphasis settings, a jitter pulsewidth measure of a signal transition skew between a received clock signal and a received data pulse by comparing the jitter pulsewidth measure to a variable delay measure that is incremented until a final incremented delay measure exceeds the jitter pulsewidth measure; and selecting an optimum pre-emphasis gain setting from the plurality of adjustable pre-emphasis settings which has a minimal final incremented variable delay measure, wherein generating the clock signal comprises transmitting the clock signal from a clock transmit pad connected over a first transmission channel in a clock loopback configuration to a clock receiver pad.

9. The method of claim 8, where the steps are performed by hardware circuitry embodied in a single integrated circuit chip.

10. The method of claim 9, where the steps are periodically performed during operation of the single integrated circuit chip to continually monitor and characterize ISI jitter and make corresponding adjustments to the optimum pre-emphasis gain setting to reduce power consumption while maintaining jitter performance across a range of operating conditions.

11. A method for adaptively controlling pre-emphasis gain in a low voltage differential signaling (LVDS) driver circuit, comprising:

generating a clock signal for transmission over a loopback path to be received as a clock signal at a clock receiver;

generating, for each of a plurality of adjustable pre-emphasis settings, a plurality of data signal pulses using one of the plurality of adjustable pre-emphasis settings for transmission over a loopback path to a data receiver;

detecting, for each of a plurality of adjustable pre-emphasis settings, a jitter pulsewidth measure of a signal transition skew between a received clock signal and a received data pulse by comparing the jitter pulsewidth measure to a variable delay measure that is incremented until a final incremented delay measure exceeds the jitter pulsewidth measure; and selecting an optimum pre-emphasis gain setting from the plurality of adjustable pre-emphasis settings which has a minimal final incremented variable delay measure, where generating the plurality of data signal pulses comprises transmitting, for each of a plurality of adjustable pre-emphasis settings, the plurality of data signal pulses from a data transmit pad connected over a second transmission channel in a data loopback configuration to a data receiver pad.

12. The method of claim 11, where the steps are performed by hardware circuitry embodied in a single integrated circuit chip, and where the steps are periodically performed during operation of the single integrated circuit chip to continually monitor and characterize ISI jitter and make corresponding adjustments to the optimum pre-emphasis gain setting to reduce power consumption while maintaining jitter performance across a range of operating conditions.

13. A method for adaptively controlling pre-emphasis gain in a low voltage differential signaling (LVDS) driver circuit, comprising:

generating a clock signal for transmission over a loopback path to be received as a clock signal at a clock receiver;

generating, for each of a plurality of adjustable pre-emphasis settings, a plurality of data signal pulses using one of the plurality of adjustable pre-emphasis settings for transmission over a loopback path to a data receiver;

detecting, for each of a plurality of adjustable pre-emphasis settings, a jitter pulsewidth measure of a signal transition skew between a received clock signal and a received data pulse by comparing the jitter pulsewidth measure to a variable delay measure that is incremented until a final incremented delay measure exceeds the jitter pulsewidth measure; and selecting an optimum pre-emphasis gain setting from the plurality of adjustable pre-emphasis settings which has a minimal final incremented variable delay measure, where detecting the jitter pulsewidth measure for each of a plurality of adjustable pre-emphasis settings comprises connecting a received clock signal pulse and a received single data pulse as inputs to an XOR gate to generate the jitter pulsewidth measure as an XOR gate output.

14. The method of claim 13, where the variable delay measure is incremented by connecting the jitter pulsewidth measure across a plurality of delay paths in a variable delay circuit for each of the plurality of adjustable pre-emphasis settings.

15. The method of claim 14, where detecting the jitter pulsewidth measure for each of a plurality of adjustable pre-emphasis settings comprises connecting the XOR gate output and the variable delay measure as inputs to a gating circuit to generate an output pulse signal which is connected to clock a toggle flip-flop connected to generate a first output when the output pulse signal indicates that the jitter pulsewidth measure is greater than the variable delay measure and to generate a second output when the output pulse signal indicates that the jitter pulsewidth measure is less than the variable delay measure.

16. A line driver circuit with on-chip adaptive jitter reduction hardware that provides a differential signal to an external circuit, comprising:

a current steering circuit comprising first and second output nodes configured to couple first and second output drive currents to an external circuit in response to one or more input drive currents;

a current source coupled to the current steering circuit and configured to provide a first input drive current to the current steering circuit in response to first control signals;

a pre-emphasis circuit coupled to the current steering circuit and configured to receive an input signal switching between first and second signal states, and in accordance therewith provide a second input drive current to the current steering circuit in response to second control signals specifying a pre-emphasis gain setting; and an adaptive pre-emphasis gain tuning hardware control circuit comprising a pre-emphasis controller and jitter measurement hardware circuit arranged to provide said first and second control signals for controlling said current source and pre-emphasis circuit, characterized in that said adaptive pre-emphasis gain tuning hardware control circuit periodically tunes the pre-emphasis gain setting for the pre-emphasis circuit by selecting an optimum pre-emphasis gain setting which minimizes an inter-symbol interference (ISI) jitter measure for the line driver circuit, wherein the adaptive pre-emphasis gain tuning hardware control circuit periodically tunes the pre-emphasis gain setting for the pre-emphasis circuit by:

generating, for each selected pre-emphasis gain setting from a plurality of pre-emphasis gain settings, a jitter pulsewidth measure of a signal transition skew between a clock and a data pulse sent with the selected pre-emphasis gain setting; and comparing a jitter pulsewidth measure to a variable delay measure that is incremented until the variable delay measure exceeds the jitter pulsewidth measure, at which point the variable delay measure is stored with the corresponding selected pre-emphasis gain setting;

where selecting the optimum pre-emphasis gain setting comprises identifying the selected pre-emphasis gain setting which having the smallest variable delay measure.

17. A line driver circuit with on-chip adaptive jitter reduction hardware that provides a differential signal to an external circuit, comprising:

a current steering circuit comprising first and second output nodes configured to couple first and second output drive currents to an external circuit in response to one or more input drive currents;

a current source coupled to the current steering circuit and configured to provide a first input drive current to the current steering circuit in response to first control signals;

a pre-emphasis circuit coupled to the current steering circuit and configured to receive an input signal switching between first and second signal states, and in accordance therewith provide a second input drive current to the current steering circuit in response to second control signals specifying a pre-emphasis gain setting; and an adaptive pre-emphasis gain tuning hardware control circuit comprising a pre-emphasis controller and jitter measurement hardware circuit arranged to provide said first and second control signals for controlling said current source and pre-emphasis circuit, characterized in that said adaptive pre-emphasis gain tuning hardware control circuit periodically tunes the pre-emphasis gain setting for the pre-emphasis circuit by selecting an optimum pre-emphasis gain setting which minimizes an inter-symbol interference (ISI) jitter measure for the line driver circuit, wherein the adaptive pre-emphasis gain tuning hardware control circuit is configured to:

generate a clock signal for transmission over a loopback path to be received as a clock signal at a clock receiver;

generate, for each of a plurality of adjustable pre-emphasis settings, a plurality of data signal pulses using one of the plurality of adjustable pre-emphasis settings for transmission over a loopback path to a data receiver;

detect, for each of a plurality of adjustable pre-emphasis settings, a jitter pulsewidth measure of a signal transition skew between a received clock signal and a received data pulse by comparing the jitter pulsewidth measure to a variable delay measure that is incremented until a final incremented delay measure exceeds the jitter pulsewidth measure; and select an optimum pre-emphasis gain setting from the plurality of adjustable pre-emphasis settings which has a minimal final incremented variable delay measure.

18. The line driver circuit of claim 17, where the adaptive pre-emphasis gain tuning hardware control circuit periodically monitors ISI jitter to make corresponding adjustments to the optimum pre-emphasis gain setting to reduce power consumption while maintaining jitter performance across a range of operating conditions.

19. The line driver circuit of claim 16, where the current steering circuit, current source, pre-emphasis circuit, and adaptive pre-emphasis gain tuning hardware control circuit are embodied in a single integrated circuit chip.

20. The line driver circuit of claim 16, where the adaptive pre-emphasis gain tuning hardware control circuit periodically monitors ISI jitter to make corresponding adjustments to the optimum pre-emphasis gain setting to reduce power consumption while maintaining jitter performance across a range of operating conditions.

\* \* \* \* \*